United States Patent [19]

Lipovski

[11] Patent Number: 4,989,180
[45] Date of Patent: Jan. 29, 1991

[54] DYNAMIC MEMORY WITH LOGIC-IN-REFRESH

[75] Inventor: G. Jack Lipovski, Austin, Tex.

[73] Assignee: Board of Regents, The University of Texas System, Austin, Tex.

[21] Appl. No.: 321,847

[22] Filed: Mar. 10, 1989

[51] Int. Cl.⁵ .................. G11C 11/406; G11C 11/402; G11C 15/00
[52] U.S. Cl. .............................. 365/189.07; 365/222; 365/49
[58] Field of Search ...................... 365/222, 189.07, 49, 365/189.02; 364/200, 900

[56] References Cited

U.S. PATENT DOCUMENTS

| | | | |
|---|---|---|---|
| 3,508,220 | 4/1970 | Stampler | 365/189.07 |
| 4,172,282 | 10/1979 | Aichelmann, Jr. et al. | 364/200 |
| 4,232,376 | 11/1980 | Dion et al. | 365/222 |
| 4,277,833 | 7/1981 | Chambers | 365/222 |
| 4,277,838 | 7/1981 | Chambers | 365/222 |
| 4,590,465 | 5/1986 | Fuchs | 340/223 |
| 4,677,592 | 6/1987 | Sakurai et al. | 365/222 |
| 4,706,221 | 11/1987 | Satoh et al. | 365/222 |
| 4,709,327 | 11/1987 | Hillis et al. | 364/200 |
| 4,718,041 | 1/1988 | Baglee et al. | 365/185 |
| 4,783,649 | 11/1988 | Fuchs et al. | 340/747 |
| 4,833,642 | 5/1989 | Doi | 365/49 |

OTHER PUBLICATIONS

Design and Analysis of Fault Tolerant Digital Systems, pp. 63–65.
Analysis and Design of Digital Integrated Circuits, Hodges and Jackson, p. 372-Section 9.3.
Lipovski, G. J., "A Dynamic Associative Memory Chip", Dept. of Elec. and Computer Engr., Univ. of Tex., Austin, Texas (pub. date 9/4/90).
Lipovski, G. J., "Architectural Features of CASSM: A Context Addressed Segment Sequential Memory", Proc. 5th ISCA, pp. 31–38, Apr. 3–5, 1978.
Bray et al., "Data Base Computers", D. C. Heath & Co., pp. 106–120, 1979.
Fuchs et al., "Developing Pixel-Planes, A Smart Memory-Based Raster Graphics System," 1982 Conference on Advanced Research in VLSI, MIT, pp. 371–380, Jan. 27, 1982.

Primary Examiner—Alyssa H. Bowler
Attorney, Agent, or Firm—Arnold, White & Durkee

[57] ABSTRACT

The invention is a dynamic storage device requiring periodic refresh, and including logical operation circuitry within the refresh circuitry. The individual storage positions of the storage device are periodically read by a refresh amplifier, and then a logical operation is performed on the refresh data before application to the write amplifier. This allows implementation of associative data base searching by cyclically executing a data compare operation within the refresh circuitry.

5 Claims, 3 Drawing Sheets

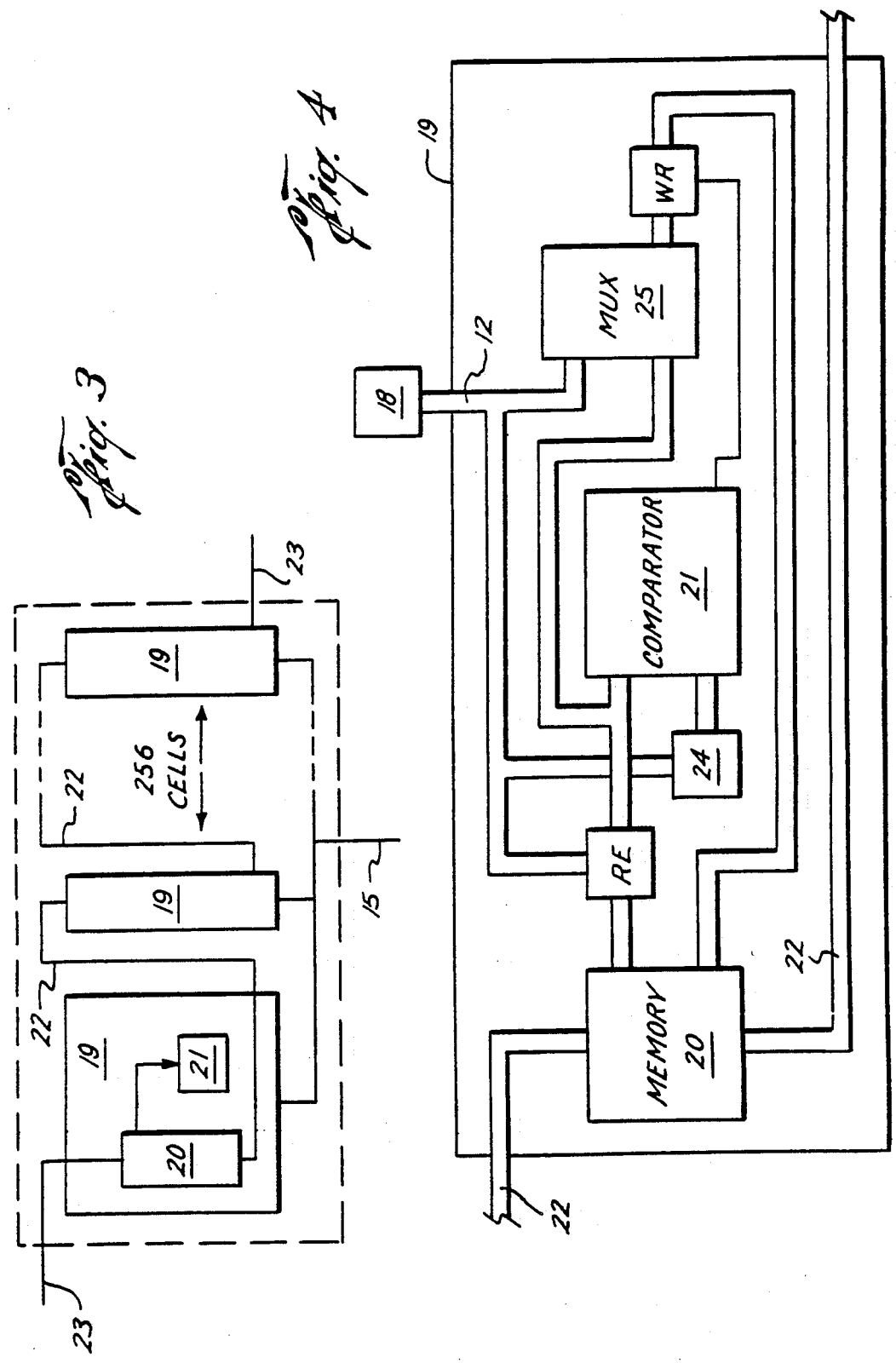

DYNAMIC MEMORY WITH LOGIC-IN-REFRESH

FIELD OF THE INVENTION

The invention relates to refreshable dynamic memory storage devices.

BACKGROUND OF THE INVENTION

Referring to FIG. 1, a schematic of a typical construction of a dynamic random access memory (DRAM) is shown. During the write mode, data to be written into the DRAM is applied to the input and amplified by write amplifier WR. Switches S2 and S3 are open, switches S1 and S4 are closed, and capacitor C is either charged or discharged according to the status of the input data, as amplified by write amplifier WR. During the read mode, switches S1, S3 and S4 are open, and switch S2 is closed so that the voltage on capacitor C is compared to a reference voltage Vref by read amplifier RE. According to the difference determined by read amplifier RE, either a binary "one" or "zero" is transmitted to the output of the DRAM. When in the data-hold mode, all the switches S1, S2, S3 and S4 remain open so that the stored charged remains in capacitor C. However, due to the unavoidable presence of leakage resistance R, the capacitor charge will gradually dissipate. To compensate for this, a process called refreshing must be periodically used in the DRAM. To achieve refreshing, all three switches S1, S2, and S3 are closed and switch S4 is open, and the binary state detected by read amplifier RE is amplified by write amplifier WR and reapplied to storage capacitor C. Switches S3 and S4 thus form a multiplexer which selects either input data or refresh data for application to write amplifier WR. The dashed line in FIG. 1 represents the boundary of an integrated circuit chip. Elements within the dashed line are typically integrated on a single chip.

In practice, a DRAM includes a great number of storage capacitors C arranged in matrix or array form along with row decoder and column decoder circuitry. The storage elements of the array must be periodically refreshed, and are typically refreshed on a row-by-row basis. The row decoder and column decoder circuitry, as well as the read amplifiers and write amplifiers, are typically integrated within the same semiconductor chip with the individual storage elements of the array. FIG. 2 is a block diagram of a type HM 511000 dynamic RAM available from Hitachi America, Ltd., which includes eight 128k memory cell arrays 10 connected through read/write amplifiers 11 to I/O bus 12. Individual rows and columns of the cell arrays 10 are selected by row decoder 13 and column decoder 14, under control of address data contained on address bus 14 via row address buffer 16 and column address buffer 17, and under control of row access strobe signal, RAS, and column access strobe signal, CAS. Reading and writing is controlled by read/write input, WE, and one-bit input and output data is buffered in I/O buffer 18. Once again, elements within the dashed line in FIG. 2 are integrated together on a single chip.

When logical operations are required to be performed on data stored in a DRAM, data must be read from the desired storage elements of the array and applied to the single-bit output of the DRAM for application to logic circuitry external to the integrated circuit chip. After the logic function is performed, the result is applied to the single-bit input of the DRAM for buffering and storage in desired storage elements of the array. Such operation of a dynamic RAM is found, for example, in single-instruction-multiple-datastream (SIMD) computers wherein a single logical operation is performed on a plurality of data elements. Such SIMD operations may be performed cyclically in order to trade off cost for speed. During cyclic operation, the same operation is performed in one or more data cells, and within each data cell, the operation is performed identically on one or more data words which are processed sequentially. However, as mentioned above, periodic refreshing of the dynamic RAM is necessary in order to avoid dissipation of the data indicating charge on the storage capacitor. This refreshing is generally interleaved with any logical operations performed on the data, which necessarily limits the speed at which cyclic logical operations can be performed on data stored in a dynamic RAM.

SUMMARY OF THE INVENTION

The present invention avoids the drawbacks of the prior art by incorporating logic circuitry within the refresh circuitry of a dynamic RAM which allows performance of cyclic logical operations on stored volatile data, concurrent with the periodic refresh of the volatile data. Thus, all data being refreshed is processed by a simple logical unit in the refresh circuit. This combination of refresh with logical operation eliminates the need for a separate refresh cycle by performing the logical operation during the refresh cycle, and greatly improves the cyclic processing speed of logical operations performed on stored data.

The present invention has particular application in data base storage systems wherein all stored data is accessed and tested, for example, when conducting data string searches. In such a data base searching system, a data comparator is inserted into the refreshing loop, and is used to compare target data with data being cyclically refreshed in order to simultaneously perform data refresh and target data searching.

BRIEF DESCRIPTION OF THE DRAWINGS

FIG. 3 is a dynamic random access memory employing logic in refresh circuitry, according to the present invention.

FIG. 4 is a dynamic random access memory employing search logic in the refresh circuitry, according to the present invention.

DETAILED DESCRIPTION OF THE PREFERRED EMBODIMENT

Figure 1:
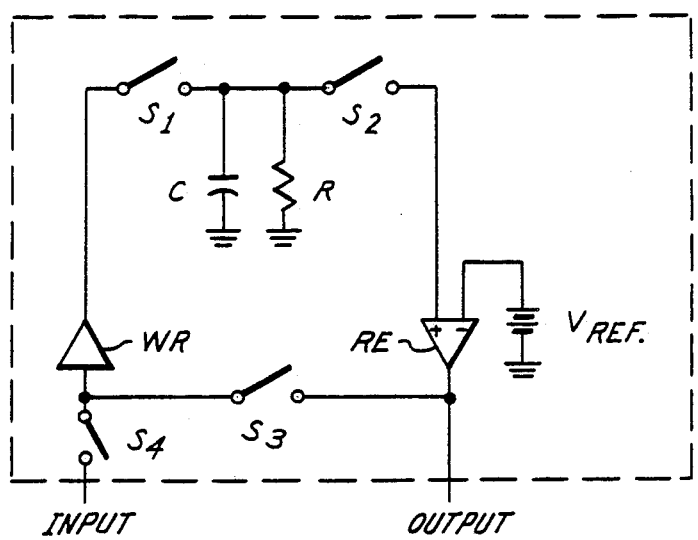
FIGS. 1 and 2 are schematic representations of prior art dynamic random access memories.
Figure 2:
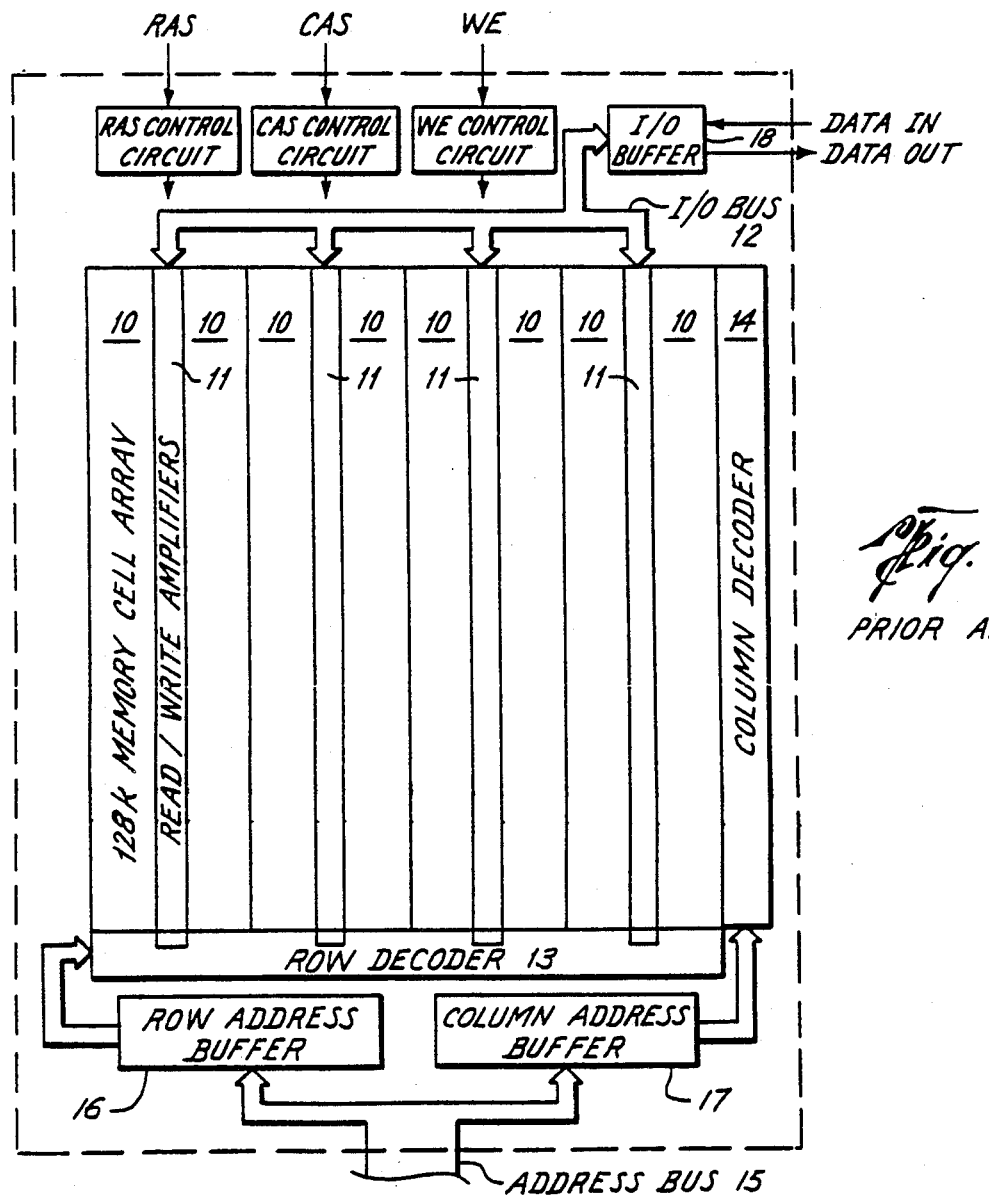

Referring to FIG. 3, a one megabit volatile memory employing logic-in-refresh according to the present invention is disclosed. The memory is organized within the chip as a 512 word, 2048 bit-per-word memory in which an entire 2048 bit word is read and rewritten each memory cycle, and all 512 words are read, one after another, in each refresh cycle. The refresh word unit length might be different from the length of the associative memory word unit that can be searched or output as a unit. Either the entire 2048 bit word, or a fraction of the 2048 bit word, can be considered a single word in an associative memory. For example, referring to FIG. 3, if an 8-bit byte is chosen as the length of the associative memory word in a 1 megabit memory, 256 cells 19 result, each having a 512 word memory array 20, 8-bits-per-word. Herein, a "word" refers to a unit of data read or written as a whole.

According to the present invention, each cell 19 includes logic circuitry, such as comparator 21, to operate on the data as it is sequentially and cyclically read out, refreshed and written back into memory. During refresh a 9-bit counter, either external or internal to the chip, provides 512 consecutive row addresses, one address per memory refresh cycle. Thus, all words of each cell 19 of the memory are read in 512 memory refresh cycles and are searched during that time. The bottom word of each cell 19 is logically linked to the top word of the next cell 19 within a single chip by bus 22. Elements within the dashed line are integrated together in a single semiconductor material integrated circuit chip. A plurality of chips can be cascaded by logically linking the bottom word of the last cell in one chip to the top of the next cell in the neighboring chip by bus 23.

The configuration of each cell 19 is shown in more detail in FIG. 4. Referring to FIG. 4, data stored in each 8-bit-word can be, for example, ASCII characters in text streams, which are each 7 bits wide together with a mark bit which is the 8th bit. Initially, all mark bits are cleared, and are subsequently set and cleared to mark the results of a search. Each word is sequentially read by 8-bit wide read amplifier, RE, and the 7 data bits are applied to comparator 21 where the read 7-bit word is compared with 7-bit comparand stored in comparand register 24. A comparand is loaded into comparand register 24 through I/O bus 12.

The output of read amplifier, RE, is also applied to multiplexer 25 along with data from I/O buffer 18 through I/O bus 12. The output of multiplexer 25 is applied to 8-bit write amplifier, WR, along with the single-bit (mark bit) output of comparator 21. Read amplifier, RE, is also connected to I/O bus 12 in a known manner through tristate buffers, or the like, to enable outputting of data. Thus, according to the present invention, comparator 21 and comparand register 24 are added to the preexisting refresh circuitry of a DRAM illustrated schematically in FIG. 1 (note that switches S3 and S4 illustrate the function of multiplexer 25). All components are integrated on the same semiconductor material integrated circuit chip.

In operation, to search-and-mark, a comparand is simultaneously broadcast to all cells 19, and stored in respective comparand registers 24. Then, the 512 words in memory array 20 of each cell 19 are cyclically read, refreshed and rewritten. The 8th bit of each word stores the result of any match with the comparand in comparand register 24. The results of the match are stored in 8th bit of the next word in memory array 20 adjacent and below the one that the comparand matches. This is repeated for all 512 words in each cell 19. The result of a search on the last word of a cell is effectively stored in the first word of the adjacent cell through bus 22.

If all mark bits are cleared, and the comparand searches for a 7-bit character and a zero as the 8th bit, an unconstrained search for a character is done. If the comparand searches for a character and a 1 in the 8th bit, a search for the character will then match the comparand only if the previous word stored in memory array 20 matched the previous comparand searched. Thus, a string of characters can be searched for, one character in each successive refresh cycle.

A variation of this operation is to continue to mark words in memory until a match is found. In this variation, once the 8th bit (mark bit) of a word has been set, as words continue to rotate through the refresh circuitry, the 8th bit of all subsequent words are set until a match for the next comparand (for example, and end-of-text character) is found. This variation is used to mark the remainder of a target string of characters, once a character within the target string is found, and facilitates output of or rewriting the target string.

The output of the result of a search from a single cell can simply be read out as the character into I/O buffer 18 if the 8th bit is set. As a word passes the refresh logic, if the 8th bit is set, the word is presented by read amplifier, RE, to I/O buffer 18 and the 8th bit will then be cleared. In a multiple cell system, if two cells have the 8th bit set in the same word in each cell, a priority circuit connected to the cells will prevent all but one of the outputs from feeding I/O buffer 18, and clearing the 8th bit. Only one word will be output at a time, and remaining words will be output in later refresh cycles.

After power is applied, a means to fill memory with identical words is used to empty the memory. To fill an empty memory with a string of characters a known ripple priority mechanism can be used to modify the basic search and match mechanism so that only the first word that satisfies the search part is modified, but no other words that satisfy the search are altered. Within a single cell, a flip-flop is set as the words in the cell are being searched, and is cleared after a successful search is detected. The word is modified in a successful search only if the flip-flop output is 1. One word can be written in each refresh cycle by this means. In a multiple cell system, a ripple priority circuit is also used between cells. The priority circuit causes all flip-flops except the flip-flop in the prior cell to be cleared. This prioritized context-addressing mechanism is needed to fill memory with different data in each word.

Figure 5:
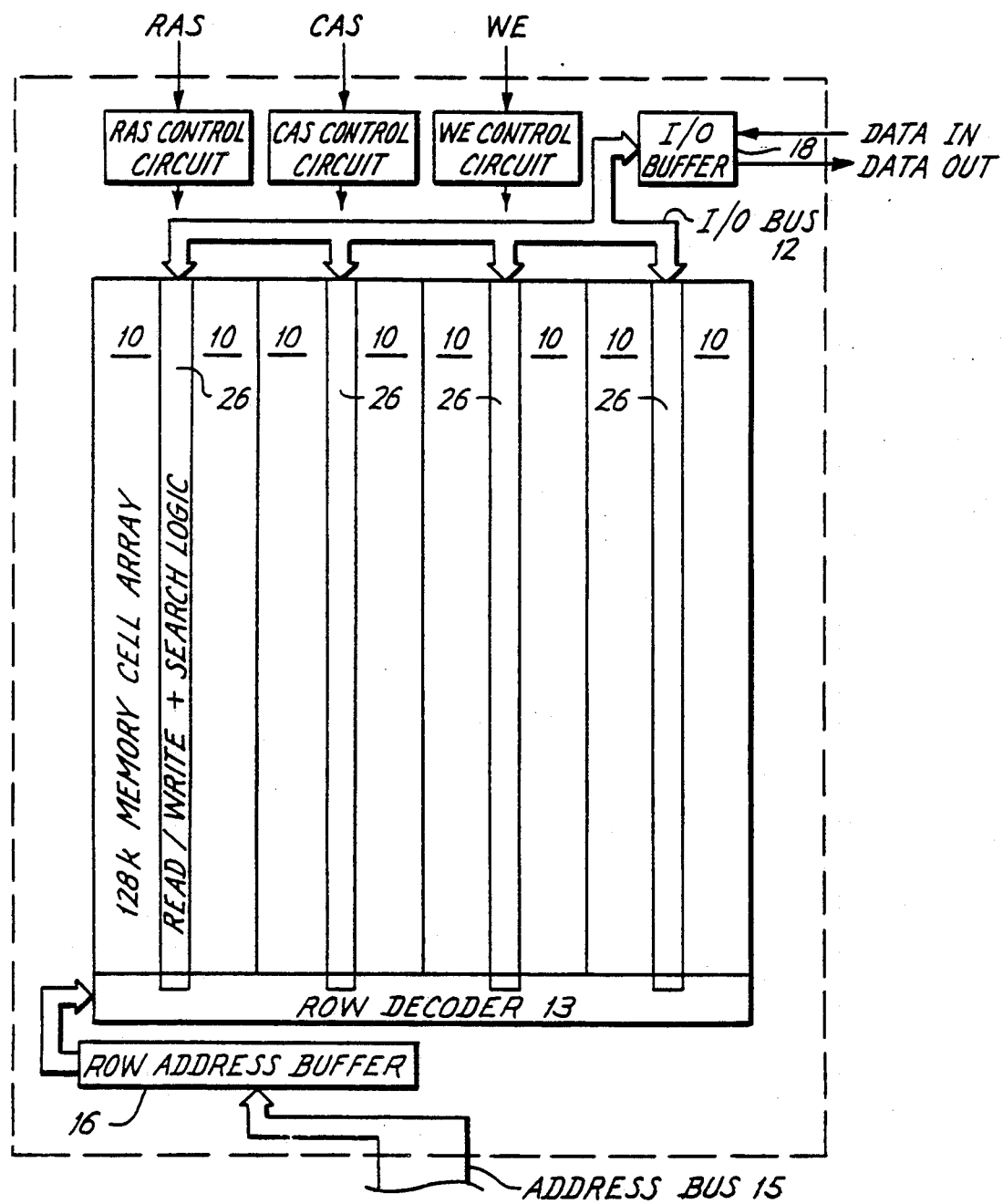
FIG. 5 is a block diagram of a 1 megabit dynamic random access memory employing logic in refresh circuitry according to the present invention.

The above-disclosed additional search logic can be easily implemented in existing dynamic random access memories by using preexisting memory cells, row decoders, read amplifiers, write amplifiers and multiplexers but removing the column decoders and inserting search logic including the comparator and comparand register into the read/write circuits. If this is done, for example in the Hitachi HM511000 (a 1 megabit DRAM), the entire memory can be read, searched and rewritten in approximately 60 microseconds (the time required to refresh the entire memory). Such a memory is shown in FIG. 5 and illustrates placement of search logic 26. If a system incorporates a number of memory chips, and a string of characters is searched, the time required to search all data in memory will remain 60 microseconds per character searched.

Although content search and update, input and output are the logical operations herein disclosed, it will be understood that other logical techniques can also be implemented. For example, the various techniques used for searching and updating a data base, such as a relational data base, as disclosed in "Architectural Features of CASSM; A Context Addressed Segment Sequential Memory," Proc. 5th ISCA, pp 31–38, April, 1978, authored by the present inventor, and related work on the CASSM system cited in that paper, can be implemented. Other modifications, additions or deletions can also be made without departing from the scope of the invention. For example, the present invention is equally applicable to memories, only a portion of which is dynamic memory.

The invention thus allows associative searching of a dynamic memory integrated circuit with a redesign of only a small part (removing column decoders, and adding comparators and comparand registers to the refresh circuitry) of a pre-existing chip memory. This results in low development cost, little if any increase in manufacturing cost, and utilization of existing DRAM facilities without the need for extensive retooling Use of the invention will allow associative searching of very large data bases stored entirely in fast dynamic memory with very little increase in cost over an unmodified dynamic random access memory.

What is claimed is:

1. A data storage and logical operation apparatus comprising:
    dynamic data storage means, integrated on a single semiconductor material chip, for storing a plurality of words in adjacent word storage positions, said dynamic data storage means requiring refreshing in order to retain data;
    means, integrated on said single semiconductor material chip, for periodically refreshing said dynamic data storage means in order to retain a state of data in said dynamic data storage means, including means for cyclically refreshing said words in said adjacent storage positions;
    logic means, including a data comparator integrated on said single semiconductor material chip, connected to said means for cyclically refreshing, for comparing a predetermined comparand with each word stored in said adjacent word storage positions during refreshing, and for providing an indication of a match between said predetermined comparand and a target word; and
    means for setting at least one mark bit of a word in a word storage position adjacent a storage position of said target word, responsive to said indication of a match.

2. A data storage and logical operation apparatus comprising: p1 dynamic data storage means, integrated on a single semiconductor material chip, for storing a plurality of words in adjacent word storage positions, said dynamic data storage means requiring refreshing in order to retain data;
    means, integrated on said single semiconductor material chip, for periodically refreshing said dynamic data storage means in order to retain a state of data in said dynamic data storage means, including means for cyclically refreshing said words in said adjacent storage positions;
    logic means, including a data comparator integrated on said single semiconductor material chip, connected to said means for cyclically refreshing, for comparing a predetermined comparand with each word stored in said adjacent word storage positions during refreshing, and for providing an indication of a match between said predetermined comparand and a target word;
    means for marking a respective target word upon to said indication of a match; and 3. A data storage and logical operation apparatus comprising:
    dynamic data storage means, integrated on a single semiconductor material chip, for storing a plurality of words in adjacent word storage positions;
    means, integrated on said single semiconductor material chip, for periodically refreshing said dynamic data storage means, including means for cyclically refreshing said words in said adjacent storage positions, said means for cyclically refreshing having means for reading each word, and means for writing each word after reading;
    logic means, including a data comparator integrated on said single semiconductor material chip, connected to said means for cyclically refreshing, for comparing a predetermined comparand with each word stored in said adjacent word storage positions during refreshing, and for providing an indication of a match between said predetermined comparand and a target word; and
    data multiplexer, integrated on said single semiconductor material chip, connected intermediate said means for reading and said means for writing, for selecting either data from said means for reading or data from an external data source for application to said means for writing, said data multiplexer having a first input connected to an output of said means for reading, a second input connected to said external data source, and an output connected to an input of said means for writing.

4. A data storage device comprising:
    a plurality of dynamic data storage positions, integrated on a single chip of semiconductor material, for storing a respective plurality of data words;
    a data refreshing circuit, integrated on said single chip, including a read amplifier for cyclically reading said plurality of data words, and a write amplifier, connected to said read amplifier, for cyclically writing said plurality of data words;
    a data comparator, integrated on said single chip, connected intermediate said read amplifier and said write amplifier for cyclically comparing each of said plurality of data words with a predetermined comparand, and for providing an indication of comparison when said predetermined comparand matches at least one of said plurality of data words; and
    a data multiplexer, integrated on said single chip, connected intermediate said read amplifier and said write amplifier, for selecting a data word read by said read amplifier or a data word from an external data source, for application to said write amplifier.

5. The device of claim 4, further comprising:
    a comparand register, integrated on said single chip, for storing said comparand.

* * * * *

UNITED STATES PATENT AND TRADEMARK OFFICE
CERTIFICATE OF CORRECTION

PATENT NO. : 4,989,180

DATED : January 29, 1991

INVENTOR(S) : G. Jack Lipovski

It is certified that error appears in the above-identified patent and that said Letters Patent is hereby corrected as shown below:

Claim 2, column 5, line 44, delete "pl";

column 6, line 3, delete "to".

Signed and Sealed this

Seventh Day of July, 1992

*Attest:*

DOUGLAS B. COMER

*Attesting Officer*   Acting Commissioner of Patents and Trademarks